US 8,194,484 B2

(12) United States Patent
Lee et al.

(10) Patent No.: US 8,194,484 B2
(45) Date of Patent: Jun. 5, 2012

(54) CIRCUIT PRECHARGING DRAM BIT LINE

(75) Inventors: Cheon An Lee, Hwasung-si (KR);
Seong Jin Jang, Seongnam-si (KR);
Jong Pil Son, Yongin-si (KR); Sang Joon Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 197 days.

(21) Appl. No.: 12/787,567

(22) Filed: May 26, 2010

(65) Prior Publication Data
US 2011/0002183 A1    Jan. 6, 2011

(30) Foreign Application Priority Data
Jul. 1, 2009    (KR) .................. 10-2009-0059635

(51) Int. Cl.
*G11C 7/00*    (2006.01)
(52) U.S. Cl. ........................ 365/203; 365/149
(58) Field of Classification Search .............. 365/203, 365/159
See application file for complete search history.

(56) References Cited

U.S. PATENT DOCUMENTS

| | | | |
|---|---|---|---|
| 7,057,949 B1 * | 6/2006 | Pan et al. | 365/203 |
| 7,443,747 B2 * | 10/2008 | Lien et al. | 365/203 |
| 7,460,390 B2 * | 12/2008 | Yamamura | 365/145 |

FOREIGN PATENT DOCUMENTS

| | | |
|---|---|---|
| JP | 05250874 A | 9/1993 |
| KR | 10199410463 A | 5/1994 |
| KR | 1020060102143 A | 9/2006 |
| KR | 1020080026024 A | 3/2008 |

* cited by examiner

*Primary Examiner* — Son Dinh
(74) *Attorney, Agent, or Firm* — Volentine & Whitt, PLLC

(57) ABSTRACT

A bit line pre-charge circuit for a dynamic random access memory (DRAM) uses a charge sharing scheme. The pre-charge circuit includes switching elements disposed between a power voltage node and an output node, capacitors connected between intermediate nodes and ground. The switching elements being operated by successively activated control signals to effectively charge a bit line pair to one half a power voltage using charge sharing between the capacitors.

18 Claims, 7 Drawing Sheets

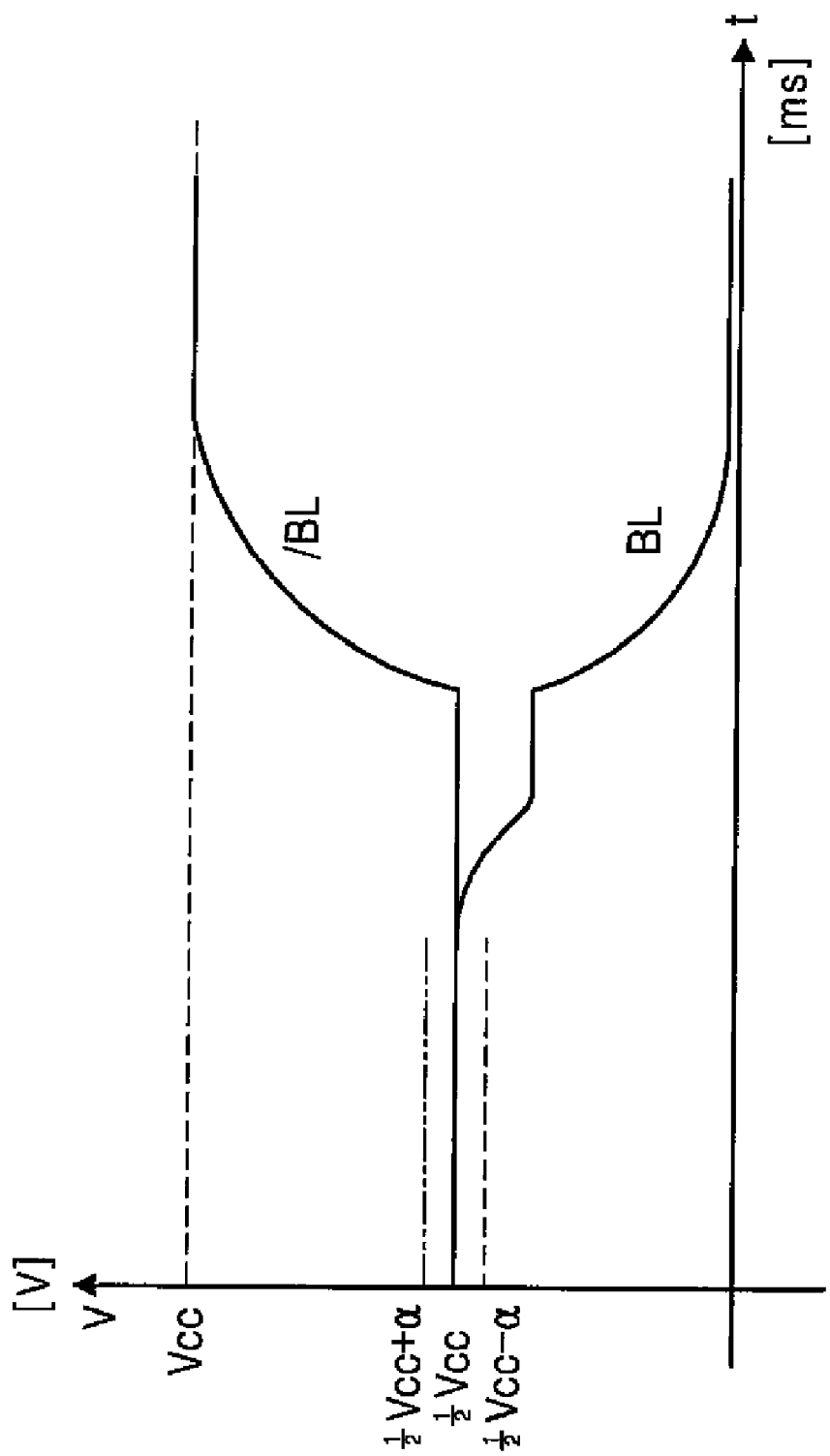

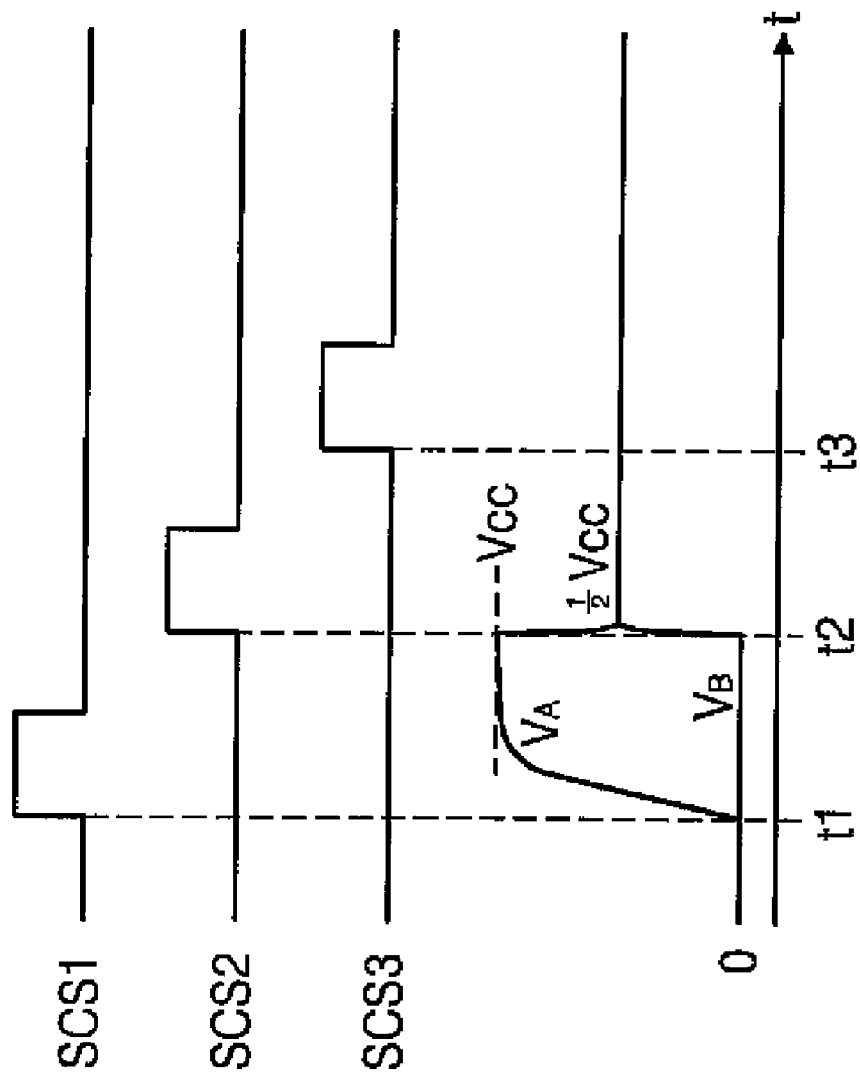

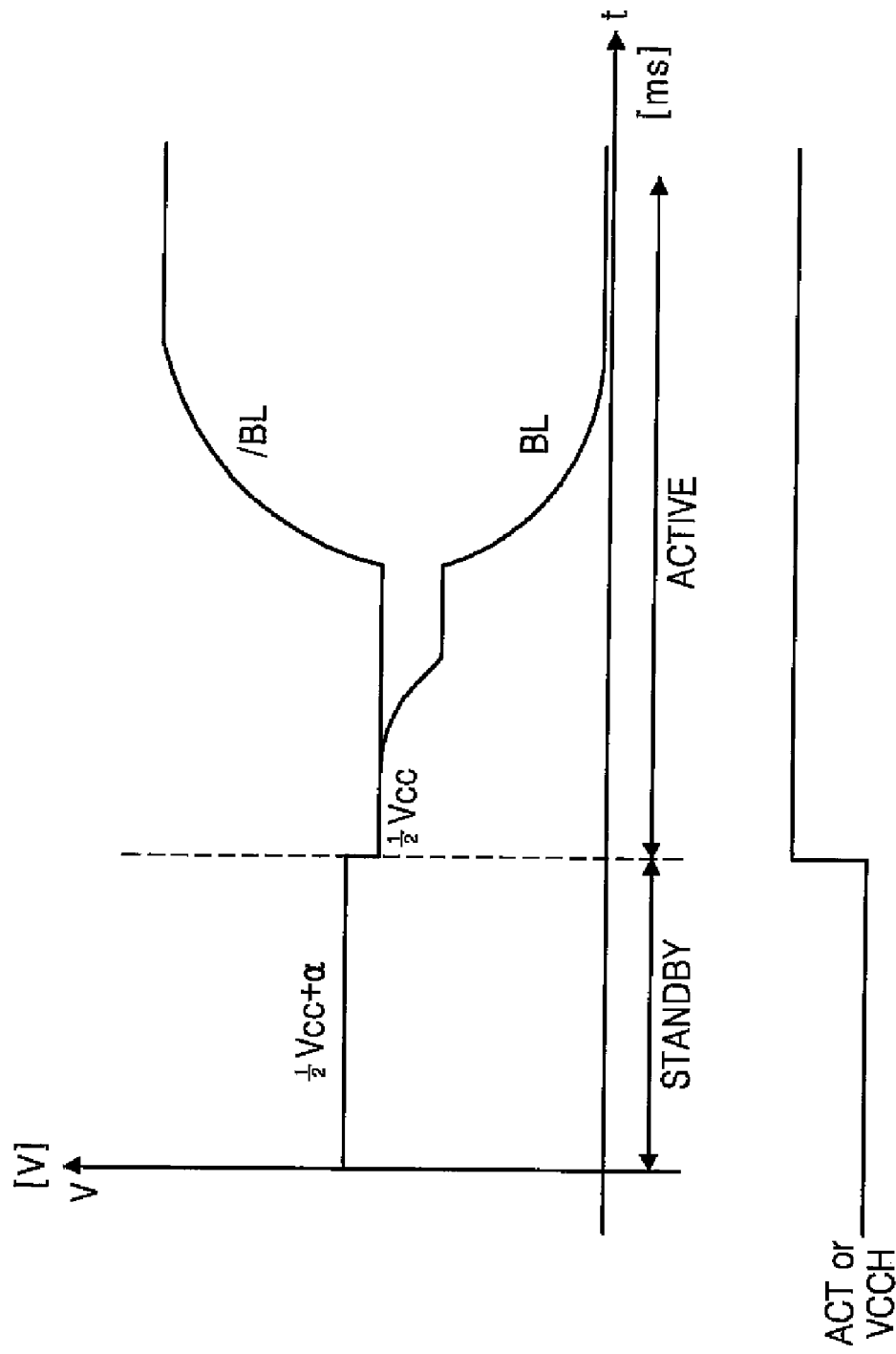

CIRCUIT PRECHARGING DRAM BIT LINE

CROSS-REFERENCE TO RELATED APPLICATIONS

This U.S. non-provisional patent application claims priority to Korean Patent Application No. 10-2009-0059635, filed on Jul. 1, 2009, the subject matter of which is hereby incorporated by reference.

BACKGROUND

The present inventive concept relates to voltage control circuits and methods adapted for use in memory devices. More particularly, the inventive concept relates to a circuit in a dynamic random access memory (DRAM) capable of pre-charging a bit line with a voltage corresponding to a half of a power voltage.

In many semiconductor memory devices such as the DRAM, a predetermined pre-charge voltage is applied to a bit line pair, and then data stored in a memory cell connected to the bit line pair is sensed on the basis of a voltage variation apparent on the bit line pair in response to an applied sensing enable signal.

It is typical for the DRAM to pre-charge the bit line pair to one half of a power voltage using a conventionally understood pull-up/pull-down operation. By a pulling-up/pulling down the voltage applied to a transistor of a conventional pre-charge circuit, the bit line pair may be pre-charged to a voltage equal to one half a power voltage.

However, in many conventional pre-charge circuits there is a risk that a DC current path may be unintentionally formed between the power voltage and ground during the pull-up/pull-down operation. Such an occurrence may be caused by the pull-up/pull down transistors being turned ON simultaneously due to a mismatch between the transistors. The resulting circuit condition is referred to as a dead zone wherein all of the pull-up/pull-down transistors are open. This dead zone condition may be formed with about tens of milli-volts (mV) of amplitude, and the conventional pre-charge circuit may not pre-charge the power voltage to ½ when operating in the dead zone.

The data sensing problems that result from inadequate dead zone pre-charging have become recently more acute as the unit element size and corresponding operating voltages of contemporary DRAMs have been reduced. That is, even a reduction in the range of tens of milli-volts in the dead zone will adversely impact DRAM sensing margins.

SUMMARY

Embodiments of the inventive concept provide a bit line pre-charge circuit capable of fully and reliably pre-charging a bit line pair to a voltage corresponding to one half of a power voltage using a charge sharing technique.

In one embodiment, the inventive concept provides a bit line pre-charge circuit providing a pre-charge voltage equal to one half a power voltage to a bit line pair of a dynamic random access memory (DRAM), the pre-charge circuit including; a first switching element disposed between a power voltage node at which the power voltage is apparent and a first node, the first switching element being controlled by a first control signal, a first capacitor connected between the first node and ground, a second capacitor connected between a second node and ground, a second switching element connected between ground and a node between the first node and the second node, the second switching element also being controlled by the first control signal, a third switching element disposed between the first node and the second node, the third switching element being controlled by a second control signal, and a fourth switching element disposed between the second node and an output node at which the pre-charge voltage is apparent, the fourth switching element being controlled by a third control signal.

In another embodiment, the inventive concept provides a bit line pre-charge circuit providing a pre-charge voltage equal to one half a power voltage to a bit line pair of a dynamic random access memory (DRAM), the pre-charge circuit including; a first pre-charge circuit configured to pre-charge an output node connected to the bit line pair to a preliminary voltage, and a second pre-charge circuit configured to further pre-charge the output node to one half the power voltage following pre-charging of the output node to the preliminary voltage. The second pre-charge circuit includes; a first switching element disposed between a power voltage node at which the power voltage is apparent and a first node, the first switching element being controlled by a first control signal, a first capacitor connected between the first node and ground, a second capacitor connected between a second node and ground, a second switching element connected between ground and a node between the first node and the second node, the second switching element also being controlled by the first control signal, a third switching element disposed between the first node and the second node, the third switching element being controlled by a second control signal, and a fourth switching element disposed between the second node and an output node at which the pre-charge voltage is apparent, the fourth switching element being controlled by a third control signal.

In yet another embodiment, the inventive concept provides a semiconductor memory system comprising: a processor operatively connected to a semiconductor memory device via a system bus, wherein the semiconductor memory device includes; a controller configured to generate a plurality of control signals controlling operation of the semiconductor memory device, the plurality of control signals including a first control signal, a second control signal and a third control signal, and a bit line pre-charge circuit providing a pre-charge voltage equal to one half a power voltage to a bit line pair within the semiconductor memory device. The pre-charge circuit includes; a first pre-charge circuit configured to pre-charge an output node connected to the bit line pair to a preliminary voltage, and a second pre-charge circuit configured to further pre-charge the output node to one half the power voltage following pre-charging of the output node to the preliminary voltage. The second pre-charge circuit includes; a first switching element disposed between a power voltage node at which the power voltage is apparent and a first node, the first switching element being controlled by the first control signal, a first capacitor connected between the first node and ground, and a second capacitor connected between a second node and ground, wherein the first and second capacitors have the same capacitance, a second switching element connected between ground and a node between the first node and the second node, the second switching element also being controlled by the first control signal, a third switching element disposed between the first node and the second node, the third switching element being controlled by the second control signal, and a fourth switching element disposed between the second node and an output node at which the pre-charge voltage is apparent, the fourth switching element being controlled by the third control signal.

BRIEF DESCRIPTION OF THE DRAWINGS

These and/or other aspects and advantages of the inventive concept will become apparent and more readily appreciated from the following description of the embodiments, taken in conjunction with the accompanying drawings of which:

FIG. 1B is a graph illustrating the voltage state for a bit line pair during a sensing operation in the semiconductor memory device of FIG. 1A;

FIG. 2B is a switching timing diagram for the bit line pre-charge circuit of FIG. 2A;

FIG. 3B is a graph illustrating a voltage state for a bit line pair when the pre-charge circuit of FIG. 3A operates in response to an activation signal.

DETAILED DESCRIPTION OF THE PREFERRED EMBODIMENTS

Reference will now be made in some additional detail to certain embodiments of the inventive concept illustrated in the accompanying drawings. It should be noted, however, that the inventive concept may be variously embodied and should not be construed in its scope as being limited to only the illustrated embodiments. Throughout the drawings and written description, like reference numbers and labels refer to the like or similar elements.

Figure 1A:
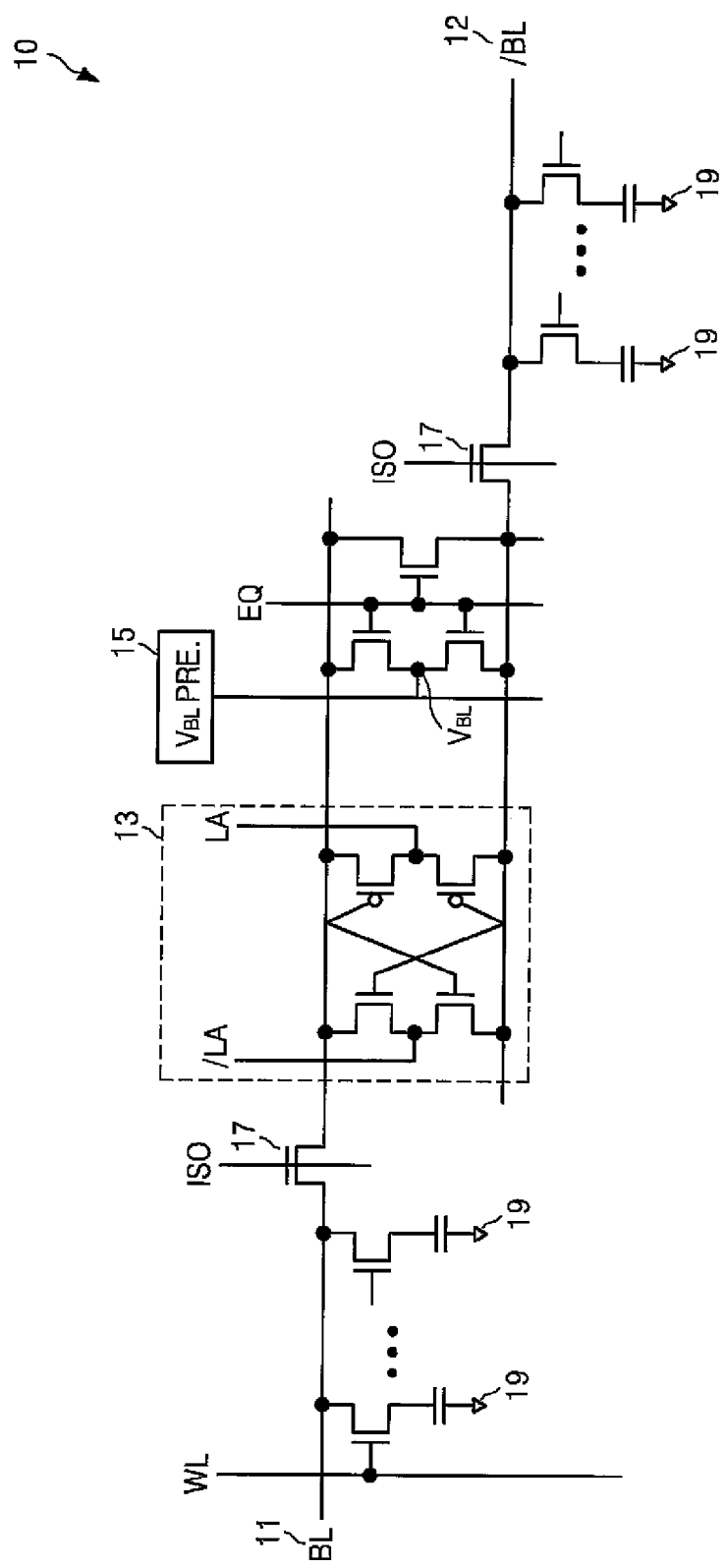
FIG. 1A is a schematic diagram of a bit line circuit in a semiconductor memory device according to an embodiment of the inventive concept.

FIG. 1A is a schematic diagram of bit line circuitry in a semiconductor memory device 10 according to an embodiment of the inventive concept. In relevant illustrated portion, the semiconductor memory device 10 comprises a memory cell array, a sense amplifying circuit 13 and an isolation transistor 17.

The memory cell array includes a bit line BL 11 and a complementary bit line /BL 12 arranged parallel, as well as a plurality of memory cells 19 connected to the bit line 11 and complementary bit line 12. The sense amplifying circuit 13 is configured to sense a voltage difference between the bit line 11 and complementary bit line 12 and is connected between the bit line 11 and complementary bit line 12.

The particular sense amplifying circuit 13 illustrated in FIG. 1A is controlled by sensing control signals LA and /LA. The sense amplifying circuit 13 also includes a P-latch sense amplifier and a N-latch sense amplifier.

The N-latch sense amplifier is formed by the two (2) NMOS transistors connected to the bit line and having a relatively lower potential between a bit line pair, (i.e., the bit line BL and complementary bit line /BL), relative to the sensing control signal /LA (e.g., ground voltage). Additionally, the P-latch sense amplifier is formed by the two (2) PMOS transistors connected to the bit line and having a relatively higher potential between the bit line pair relative to the sensing control signal LA (e.g., the power voltage).

The semiconductor memory device 10 further comprises an isolation transistor 17 configured to control electrical isolation between at least one of the bit line 11 and complementary bit line 12 and the sense amplifying circuit 13.

In the illustrated embodiment of FIG. 1A, a respective isolation transistor 17 is arranged in relation to the bit line 11 and complementary bit line 12. Thus, the isolation transistor(s) 17 may be operated to connect or disconnect the bit line 11 and/or the complementary bit line 12 to/from the sense amplifying circuit 13 in response to the isolation control signal ISO.

FIG. 1B is a graph illustrating the voltage state for the bit line pair BL and /BL during a sensing/amplifying operation within the semiconductor memory device 10 of FIG. 1A. For convenience of explanation, when a data value of "0" is read from a memory cell 19 of the semiconductor memory device 10, (i.e., when a sensing operation is performed in relation to one of the plurality of memory cells), a voltage change on the bit line BL and/or complementary bit line /BL is detected as illustrated in FIG. 1B.

Referring to FIGS. 1A and 1B, before the sensing/amplifying operation performed by the sense amplifying circuit 13, the bit line pair BL and /BL is pre-charged to a voltage state corresponding to one half a power voltage, (e.g., Vcc), via the bit line pre-charge circuit 15. As described above, when the bit line pair BL and /BL can not be properly pre-charged to a full, one half Vcc problem may arise with the resulting sensing margin.

To overcome such conventionally occurring problems, the bit line pre-charge circuit 15 according to embodiments of the inventive concept fully pre-charges the bit line pair BL and /BL to one half the power voltage Vcc using a charge sharing method. Certain embodiments of the inventive concept accomplishing this result will now be described in the context of FIGS. 2A through 3B.

Figure 2A:
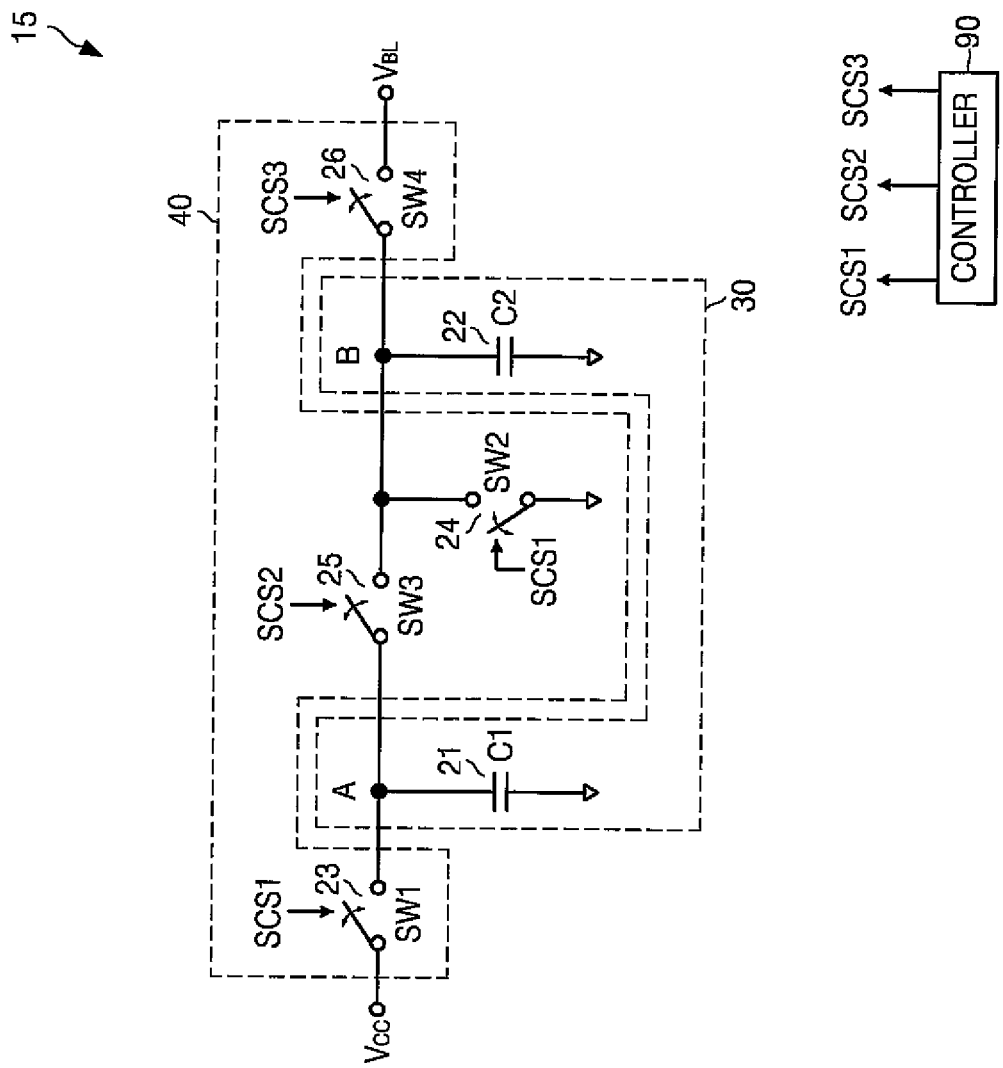
FIG. 2A is a schematic diagram of a bit line pre-charge circuit according to an embodiment of the inventive concept.

FIG. 2A is a schematic diagram of the bit line pre-charge circuit 15 according to an embodiment of the inventive concept. The pre-charge circuit 15 comprises a charging circuit 30 connected to a node at which the power voltage Vcc is apparent and providing electrical charge in relation to the power voltage Vcc. The pre-charge circuit 15 also comprises a switching circuit 40 switched such that a voltage equal to one half the power voltage Vcc (½Vcc) is applied from the charging circuit 30 to the bit line pair BL and /BL.

In the particular embodiment of FIG. 2A, the charging circuit 30 comprises a plurality of capacitors 21 and 22, each respectively connected in parallel to a power voltage node (Vcc) at which the power voltage Vcc is apparent and a node connecting the bit line pair BL and /BL, (e.g., an output node VBL providing the bit line voltage).

In the illustrated embodiment, the switching circuit 40 comprises a first switching element SW1 23 connected between the power voltage node (Vcc) and a first node A connecting the first capacitor 21. The first switching element SW1 23 is switched in response to a first control signal SCS1.

The switching circuit 40 also comprises a second switching element SW2 24 connected between the first node A and a second node B at which the second capacitor 22 is connected. The second switching element SW2 24 is also switched in response to a first control signal SCS1.

The switching circuit 40 also comprises a third switching element SW3 25 connected between the first node A and a second node B. The third switching element SW3 25 is switched in response to a second control signal SCS2.

The switching circuit 40 also comprises a fourth switching element SW4 26 connected between the second node B and the output node VBL. The fourth switching element SW4 26 is switched in response to a third control signal SCS3.

Thus the switching control signals SCS1, SCS2 and SCS3 are used to control a switching operation for switching elements 23, 24, 25 and 26. These switching control signals may be provided by a controller 90, such as the type of controller conventionally incorporated within memory devices.

Referring to the switching timing diagram of FIG. 2B, the operation of the pre-charge circuit 15 shown in FIG. 2A will now be described in some additional detail. As illustrated in FIG. 2B, each of switching control signals SCS1 to SCS3 may be successively activated (e.g., a pulse transition from low to high and back to low after a defined period) without overlap. In the sequence, each one of the plurality of switching elements 23, 24, 25 and 26 is turned OFF when its corresponding switching control signal is low, and is turned ON when its corresponding switching control signal is high. Those skilled in the art will recognize that such "high" and "low" signal levels are merely exemplary and could easily be reversed in relation to the activation/deactivation of the switching elements.

In the illustrated embodiment of FIG. 2B, when the first switching control signal SCS1 is activated at time "t1", the first switching element SW1 23 and second switching element SW2 24 are turned ON. Accordingly, the voltage difference between the terminals of the first capacitor 21, (e.g., the voltage apparent at the first node A), increases to the power voltage Vcc.

As a result, the voltage difference between the terminals of the second capacitor 22, (i.e., the voltage apparent at the second node B) is completely discharged because the second switching element SW2 24 is turned ON. It should be noted at this point that a voltage corresponding to one half of the power voltage Vcc may not necessarily be applied to the bit line pair BL and /BL during a pre-charge operation when the second node B is not fully discharged prior to a charge sharing operation.

Thus, only after the pre-charging operation is applied to the first node A and the discharge operation is applied to the second node B are complete, as controlled by the application of the first switching control signal SCS1, will the third switching element SW3 25 may be turned ON by activation of the second switching control signal SCS2 at time "t2". Using this approach, charge sharing between two capacitors 21 and 22 may be accomplished.

Since the capacitance of the first and second capacitors 21 and 22 is the same, the voltages apparent at the first node A and the second node B are equal, and equal to one half the power voltage Vcc in the illustrated example. Thus, effective charge sharing may be accomplished between the first and second capacitors 21 and 22 in response to the second switching control signal SCS2.

When the third switching control signal SCS3 is activated at time "t3" following charge sharing between the first node A and the second node B in response to the second switching control signal SCS2, the fourth switching element SW4 26 is turned ON. Accordingly, the voltage apparent at the second node B (e.g., one half the power voltage Vcc) is applied to the bit line pair BL and /BL through an output node VBL. Thus, according to the illustrated embodiment, the third switching control signal SCS3 may be used as a pre-charge enable signal. Accordingly, the bit line pair BL and /BL may be pre-charged to exactly one half the power voltage Vcc by supplying the charge-shared voltage from the second node B to the bit line pair BL and /BL when a pre-charge operation is started.

Figure 3A:
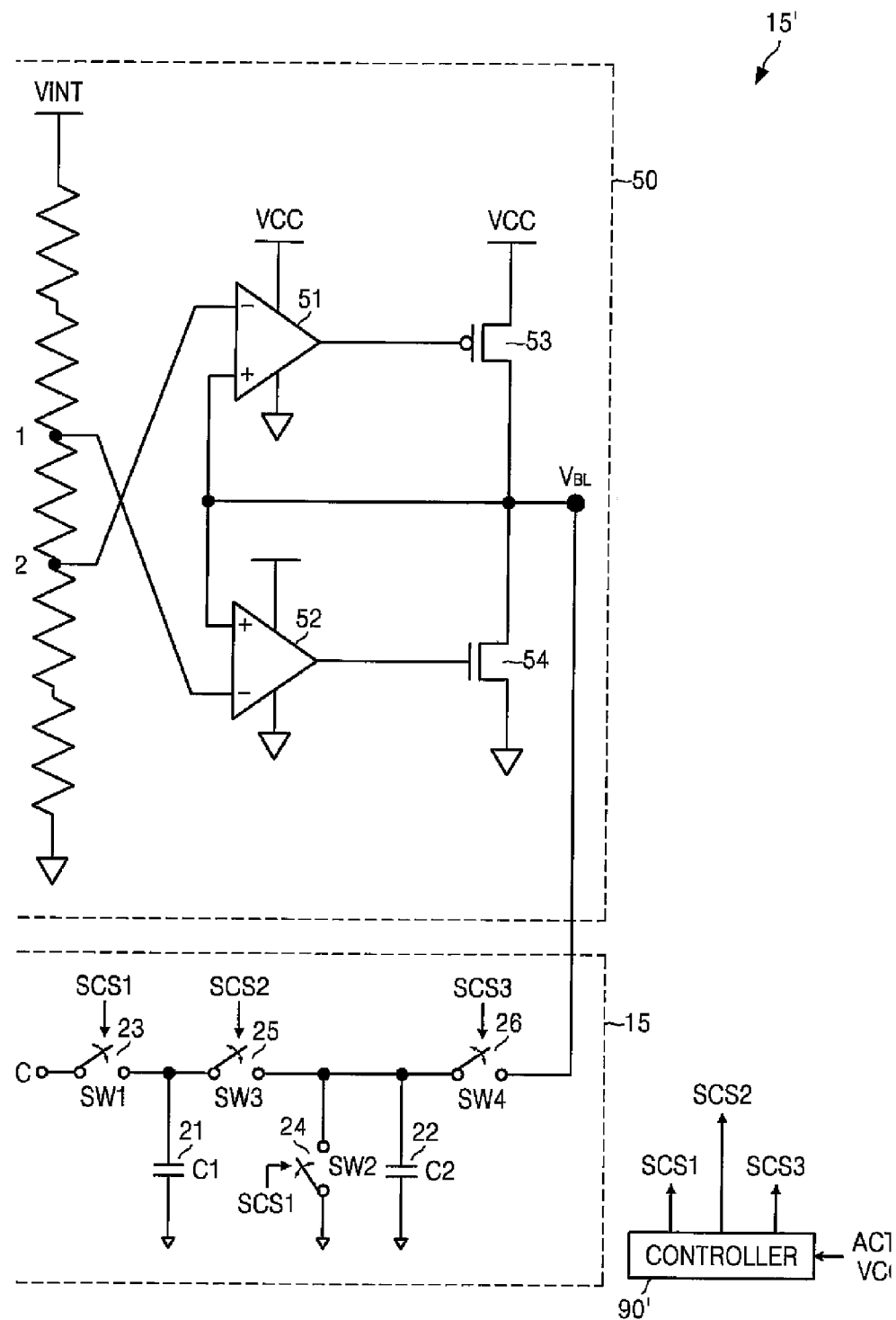
FIG. 3A is a schematic diagram of a bit line pre-charge circuit according to another embodiment of the inventive concept.

FIG. 3A is a schematic diagram of a bit line pre-charge circuit 15' according to another embodiment of the inventive concept. The bit line pre-charge circuit 15' comprises a first pre-charge circuit 50 configured to pre-charge the bit line pair BL and /BL with a first voltage, and a second pre-charge circuit 15 configured to pre-charge the bit line pair BL and /BL with a second voltage equal to one half the power voltage Vcc, following the pre-charge operation of the first pre-charge circuit 50. The second pre-charge circuit 15 is substantially the same as the pre-charge circuit described in relation to FIG. 2A, hence the same number designation.

In the illustrated embodiment of FIG. 3A, the first pre-charge circuit 50 pre-charges the output node VBL of the bit line pair BL and /BL with a first voltage when the constituent memory device is in a standby state. Here, the first voltage may be equal to one half the power voltage Vcc or some other voltage level. In other words, when the memory device is in a standby state, a pair of switching elements 53 and 54 within the first pre-charge circuit 50 is turned OFF, such that a first voltage supplied from the first pre-charge circuit 50 to the output node VBL is a preliminary voltage ranging between an upper voltage V1 and a lower voltage V2.

Here, when the operational state of the memory device transitions from standby to active in response to an externally applied activation signal ACT (or a power up signal VCCH), the second pre-charge circuit 15 also goes active and pre-charges the bit line pair BL and /BL to exactly one half of the power voltage Vcc, as described above.

In other words, when the memory device goes active, the combined operation of the first pre-charge circuit 50 and second pre-charge circuit 15 pre-charges the bit line pair BL and /BL to exactly one half the power voltage Vcc. Alternately, the first pre-charge circuit 50 may be deactivated in response to the activation signal ACT as the second pre-charge circuit 15 is activated by the same.

In the illustrated embodiment of FIG. 3A, a controller 90' within the memory device provides the plurality of switching control signals SCS1, SCS2 and SCS3 in response to the externally applied activation signal ACT (or a power up signal VCCH).

Each of the plurality of switching control signals SCS1, SCS2 and SCS3 may control the switching operation of the plurality of switching elements 23, 24, 25 and 26 in the second pre-charge circuit 15, and have a voltage corresponding to one half the power voltage Vcc supplied to the bit line pair BL and /BL accordingly. Here, an activation signal ACT applied to the controller 90' may be generated by compounding a plurality of conventionally understood and routinely apparent control signals such as /CS, /RAS, /CAS, /WE, etc. Additionally or alternately, the power up signal VCCH applied to the controller 90' may be generated from a power up signal generation circuit (not shown) within the memory device.

FIG. 3B is a graph illustrating the voltage state for the bit line pair BL and /BL when a second pre-charge circuit 15 operates in response to the activation signal ACT. For convenience of explanation, a voltage change for the bit line BL and complementary bit line /BL during a sensing operation applied to the stored data value of "0" is illustrated.

Referring to FIGS. 3A and 3B, the bit line pair BL and /BL are pre-charged by the first pre-charge circuit 50 when a memory device is in a standby state, such that a preliminary voltage is applied to the bit line pair BL and /BL through the output node VBL. The preliminary voltage may be a reasonable voltage, (e.g., ½Vcc+/−α, where α is voltage variable), and need not be equal to one half the power voltage Vcc.

When a memory device goes active, the controller 90' provides the plurality of switching control signal SCS1, SCS2 and SCS3 in response to the externally applied activation signal ACT. The second pre-charge circuit 15 then starts operation under the control of the plurality of switching control signals SCS1, SCS2 and SCS3 to pre-charge the bit line pair BL and /BL to exactly one half the power voltage Vcc.

Moreover, according to another example embodiment of the present inventive concept, an operation of the first pre-charge circuit 50 may charge the bit line pair BL and /BL when a memory device is powered up, and an operation of the second pre-charge circuit 15 may charge the bit line pair BL and /BL with a half of the power voltage Vcc after a power up operation of the memory device is completed. Alternately, the controller 90' may provide the plurality of switching control signals SCS1, SCS2 and SCS3 in response to the externally applied power up signal VCCH.

Figure 4:
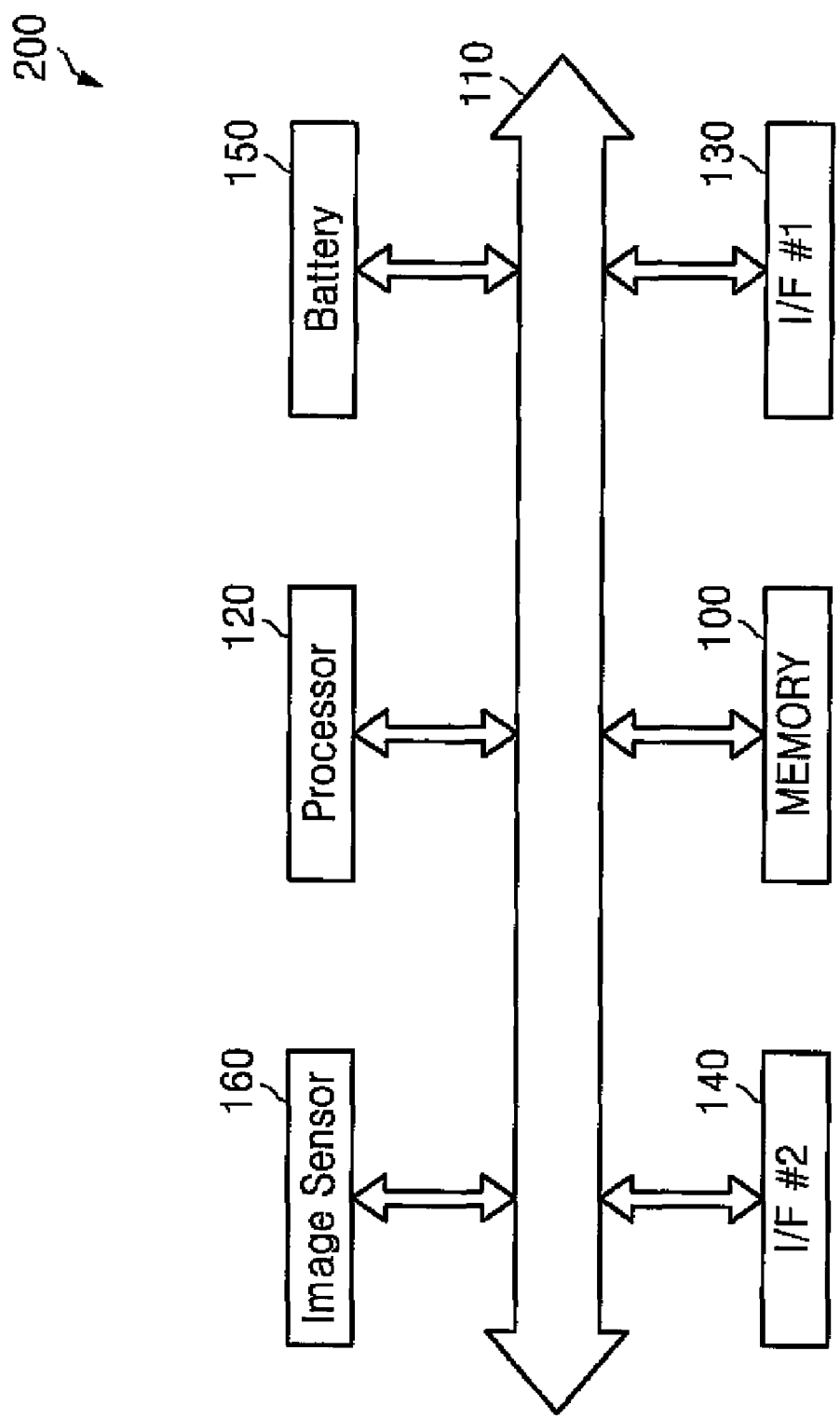
FIG. 4 is a general block diagram of a memory system including a memory device according to an embodiment of the inventive concept.

FIG. 4 is a general block diagram of a memory system 200 comprising a memory device 100 according to an embodiment of the inventive concept. Referring to FIGS. 1 through 4, the memory device 100 illustrated in FIG. 4 include a bit line pre-charge circuit such as the bit line pre-charge circuits 15 or 15' previously described.

The memory system 200 also comprises a processor 120 connected to the memory device 100 via a system bus 110.

The processor 120 may generate control signals to control the read/write operations or program/read/verification operations for the memory device 100. Accordingly, a control block (not shown) of the memory device 100 may perform a program operation or a write operation, a read operation or a verification operation in response to a control signal output from the processor 120.

According to embodiments, when the memory system 200 is embodied as a portable application, the memory system 200 may further include a battery 150 for supplying an operational power to the memory device 100 and the processor 120.

The portable application may include a portable computer, a digital still camera, a personal digital assistance (PDA), a cellular telephone, a smart phone, a MP3 player, a portable multimedia player (PMP), an automotive navigation system, a memory card, a system card, a video game, an electronic dictionary, or a solid state disk (SSD).

The memory system 200 may further include an interface, e.g., an input/output device 130, exchanging data with an external data process device. When the memory system 200 is a wireless system, the memory system 200 may further include a wireless interface 140. In this case, the wireless interface 140 is connected to the processor 120 and may transmit and receive data with an external wireless device through a system bus 110 by radio.

The wireless system may be a PDA, a portable computer, a wireless phone, a pager, a wireless device such as a digital camera, a RFID reader or a RFID system. The wireless system may be a wireless local area network (WLAN) system or a wireless personal area network (WPAN) system. The wireless system may also be a cellular network.

When the memory system 200 is an image pick-up (or capture) device, the memory system 200 may further include an image sensor 160 capable of converting an optical signal to an electric signal. The image sensor 160 may be a charge-coupled device (CCD) image sensor or a complementary metal-oxide semiconductor (CMOS) image sensor. In this case, the memory system 200 may be a digital camera or a cellular telephone with a digital camera on. In addition, the memory system 200 may be a satellite system on which a camera is attached.

A bit line pre-charge circuit according to an example embodiment of the present inventive concept may pre-charge a bit line pair included in a memory, i.e., a bit line and a complementary bit line, with a voltage corresponding to a half of a power voltage.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A bit line pre-charge circuit providing a pre-charge voltage equal to one half a power voltage to a bit line pair of a dynamic random access memory (DRAM), the pre-charge circuit comprising:
   a first switching element disposed between a power voltage node at which the power voltage is apparent and a first node, the first switching element being controlled by a first control signal;
   a first capacitor connected between the first node and ground;
   a second capacitor connected between a second node and the ground;
   a second switching element connected between the ground and a node between the first node and the second node, the second switching element also being controlled by the first control signal;
   a third switching element disposed between the first node and the second node, the third switching element being controlled by a second control signal; and
   a fourth switching element disposed between the second node and an output node at which the pre-charge voltage is apparent, the fourth switching element being controlled by a third control signal.

2. The bit line pre-charge circuit of claim 1, wherein the respective capacitances of the first and second capacitors are the same.

3. The bit line pre-charge circuit of claim 2, wherein the first control signal, the second control signal and the third control signal are successively activated.

4. The bit line pre-charge circuit of claim 3, wherein the first control signal, the second control signal and the third control signal are successively activated without overlap in respective activation periods.

5. The bit line pre-charge circuit of claim 4, wherein the successive activation of the first control signal, the second control signal and the third control signal comprises:
   activating the first control signal to simultaneously charge the first capacitor to the power voltage by connecting the first node to the power voltage node and fully discharge the second capacitor to the ground by connecting the second node to the ground, and then deactivating the first control signal;
   after deactivating the first control signal, activating the second control signal to enable charge sharing between the first and second nodes, thereby charging the second node to one half the power voltage, and then deactivating the second control signal; and
   after deactivating the second control signal, activating the third control signal to pass the one half the power voltage apparent at the second node to the output node, and then deactivating the third control signal.

6. The bit line pre-charge circuit of claim 5, wherein the third control signal serves as a pre-charge enable signal within the DRAM.

7. A bit line pre-charge circuit providing a pre-charge voltage equal to one half a power voltage to a bit line pair of a dynamic random access memory (DRAM), the pre-charge circuit comprising:
   a first pre-charge circuit configured to pre-charge an output node connected to the bit line pair to a preliminary voltage; and
   a second pre-charge circuit configured to further pre-charge the output node to one half the power voltage following pre-charging of the output node to the preliminary voltage, wherein the second pre-charge circuit comprises:

a first switching element disposed between a power voltage node at which the power voltage is apparent and a first node, the first switching element being controlled by a first control signal;

a first capacitor connected between the first node and ground;

a second capacitor connected between a second node and the ground;

a second switching element connected between the ground and a node between the first node and the second node, the second switching element also being controlled by the first control signal;

a third switching element disposed between the first node and the second node, the third switching element being controlled by a second control signal; and a fourth switching element disposed between the second node and an output node at which the pre-charge voltage is apparent, the fourth switching element being controlled by a third control signal.

8. The bit line pre-charge circuit of claim 7, wherein the respective capacitances of the first and second capacitors are the same.

9. The bit line pre-charge circuit of claim 8, wherein the preliminary voltage is not equal to one half the power supply voltage.

10. The bit line pre-charge circuit of claim 9, wherein the first control signal, the second control signal and the third control signal are successively activated.

11. The bit line pre-charge circuit of claim 10, wherein the first control signal, the second control signal and the third control signal are successively activated without overlap in respective activation periods.

12. The bit line pre-charge circuit of claim 11, wherein the successive activation of the first control signal, the second control signal and the third control signal comprises:

activating the first control signal to simultaneously charge the first capacitor to the power voltage by connecting the first node to the power voltage node and fully discharge the second capacitor to the ground by connecting the second node to the ground, and then deactivating the first control signal;

after deactivating the first control signal, activating the second control signal to enable charge sharing between the first and second nodes, thereby charging the second node to one half the power voltage, and then deactivating the second control signal; and after deactivating the second control signal, activating the third control signal to pass the one half the power voltage apparent at the second node to the output node, and then deactivating the third control signal.

13. The bit line pre-charge circuit of claim 7, wherein the first pre-charge circuit initially operates while the DRAM is in a standby state, and the second pre-charge circuit subsequently operates when the DRAM transitions from the standby state to an active state.

14. The bit line pre-charge circuit of claim 13, wherein the first pre-charge circuit initially operates during the standby state when the DRAM is first powered up.

15. A semiconductor memory system comprising: a processor operatively connected to a semiconductor memory device via a system bus, wherein the semiconductor memory device comprises:

a controller configured to generate a plurality of control signals controlling operation of the semiconductor memory device, the plurality of control signals including a first control signal, a second control signal and a third control signal; and a bit line pre-charge circuit providing a pre-charge voltage equal to one half a power voltage to a bit line pair within the semiconductor memory device, wherein the pre-charge circuit comprises:

a first pre-charge circuit configured to pre-charge an output node connected to the bit line pair to a preliminary voltage; and a second pre-charge circuit configured to further pre-charge the output node to one half the power voltage following pre-charging of the output node to the preliminary voltage, wherein the second pre-charge circuit comprises a first switching element disposed between a power voltage node at which the power voltage is apparent and a first node, the first switching element being controlled by the first control signal;

a first capacitor connected between the first node and ground;

a second capacitor connected between a second node and the ground, wherein the first and second capacitors have the same capacitance;

a second switching element connected between the ground and a node between the first node and the second node, the second switching element also being controlled by the first control signal;

a third switching element disposed between the first node and the second node, the third switching element being controlled by the second control signal; and a fourth switching element disposed between the second node and an output node at which the pre-charge voltage is apparent, the fourth switching element being controlled by the third control signal.

16. The semiconductor memory system of claim 15, wherein the semiconductor memory device is a dynamic random access memory (DRAM).

17. The semiconductor memory system of claim 16, wherein the first pre-charge circuit initially operates while the DRAM is in a standby state, and the second pre-charge circuit subsequently operates when the DRAM transitions from the standby state to an active state.

18. The semiconductor memory system of claim of claim 17, wherein the first pre-charge circuit initially operates during the standby state when the DRAM is first powered up.

* * * * *